United States Patent [19]

Hesler et al.

[11] 4,004,251

[45] Jan. 18, 1977

[54] INVERTER TRANSFORMER

[75] Inventors: Joseph P. Hesler, Liverpool; Samuel M. Korzekwa, Baldwinsville, both of N.Y.

[73] Assignee: General Electric Company, Syracuse, N.Y.

[22] Filed: Nov. 3, 1975

[21] Appl. No.: 628,099

[52] U.S. Cl. .................. 331/113 A; 321/2; 321/12; 336/83; 336/135; 336/155; 336/172; 336/212; 336/215

[51] Int. Cl.² ...................... H03K 3/281

[58] Field of Search ............ 321/2, 12, 45 R, 45 S; 331/113 A; 336/155, 83, 212, 172, 135, 215; 323/56

[56] References Cited

UNITED STATES PATENTS

| | | | |
|---|---|---|---|
| 3,237,127 | 2/1966 | Corey | 336/215 |
| 3,253,241 | 5/1966 | Tippett | 336/172 |
| 3,539,905 | 11/1970 | Schwarz | 321/2 |
| 3,541,428 | 11/1970 | Schwarz | 321/2 |
| 3,611,330 | 10/1971 | Cacossa | 321/45 R |
| 3,660,751 | 5/1972 | Bullinga | 321/2 |
| 3,697,855 | 10/1972 | Kernick et al. | 321/12 |

*Primary Examiner*—William H. Beha, Jr.
*Attorney, Agent, or Firm*—Richard V. Lang; Carl W. Baker; Frank L. Neuhauser

[57] ABSTRACT

A transformer designed to operate with a pair of power switching transistors in a d.c. to a.c. inverter is described. The transformer has an assembled core whose closed magnetic path is branched. A flux steering winding is used to ensure the prior saturation of a first branch associated with a regenerative feedback winding. Prior saturation of this branch reduces the forward drive on the switching transistors prior to full core saturation and avoids the consequent switching stresses on the transistors. The cores of the transformer are made from parts which abut at the branches so that both preformed power and preformed control windings may be used in assembling the transformer. The transformer may be assembled from conventional core configurations, and is thus of relatively low cost. A core arrangement is also disclosed in which the cross-section of the individual branches of the core may be adjusted.

10 Claims, 9 Drawing Figures

INVERTER TRANSFORMER

A transformer related to that herein disclosed is treated in U.S. Pat. No. 3,914,680, of Joseph P. Hesler and Samuel M. Korzekwa, entitled "Static Inverter".

BACKGROUND OF THE INVENTION

1. Field of the Invention

The present invention relates to static inverters by which electrical energy in the d.c. form is converted to electrical energy in the a.c. form through non-moving or static means. More particularly, the invention relates to transformers suitable for use in such inverers. Such transformers are designed to work in conjunction with a pair of alternately switched semiconductor devices connected in series with the primary winding of the transformer and producing an a.c. output in the transformer secondary. Additional feedback windings are usually present for control of the switching devices.

2. Description of the Prior Art

Known inverter transformers having windings for controlling the associated switching devices. These usually provide positive feedback either to generate oscillations or to square the output waveform. In such cases the effect is normally accompanied by driving the cores into saturation. If the cores are driven into saturation, the magnetizing reactance of the primary windings fall and in consequence the switching devices, if given a continuing forward bias, may be greatly overstressed. In the aforementioned patent application, it was proposed to sence saturation in a portion of the full core cross-section so as to terminate the drive on the switching devices prior to full core saturation and avoid the stressing. The transformer therein described utilized conventional c cores, one of which required an aperture be formed in one of the arms. Available cores lack an aperture designed for such use, and forming such an aperture is a particularly laborious procedure if it is done after the core has been sintered. In addition, the serial insertion of a winding through an aperture is a relatively slow and tedious process.

SUMMARY OF THE INVENTION

Accordingly, it is an object of the present invention to provide an improved inverter transformer.

It is another object of the present invention to provide an improved inverter transformer having a branched core and a flux steering winding to insure that a selected branch saturates prior to full core saturation.

It is still another object of the present invention to provide an improved inverter transformer having a branched core and windings associated with one or the other branch which is more readily assembled.

It is a further object of the present invention to provide an improved inverter transformer having a branched core in which at least one branch has an adjustable cross-section.

It is a further object of the present invention to provide a novel self-starting inverter.

These and other objects of the invention are achieved in a transformer adapted to be coupled to a pair of switching devices to form an inverter. The transformer has a core of substantially linear magnetic material providing a closed magnetic path along which a working cross-section is maintained for the principal flux, with the path being divided for part of its length into two branches between which the principal flux may be steered with a relatively small magnetomotive force. The core is assembled from two members which are butted at the branch to permit encirclement of the working cross-section by a preformed winding and encirclement of individual branches by a preformed winding.

A center tapped primary power winding is provided encircling the working cross-section, each end of which is adapted to be connected to an output electrode of one of a pair of alternately conducting electronic switches, and the center tap of which is adapted to be connected to a d.c. source to cause the principal flux in said core to alternate. The secondary power winding from which the a.c. output is derived also encircles the working cross-section. In addition, first control winding means are provided, adapted to be connected to the switches to cause alternate conduction. The first control winding means encircles one branch and is used to provide regenerative feedback during each conduction period. It will usually take the form of a center tapped winding. Second control winding means are also provided encircling one of the branches for providing a magnetomotive force for causing the one branch to saturate first in each conduction period. When the first branch saturates, the regenerative feedback is removed and saturation of the full working cross-section is avoided. The circuit avoids electrically stressing the switching devices at the end of the conduction periods by reducing the forward drive before saturation has reduced the magnetizing impedance of the transformer to near zero.

In accordance with another facet of the invention, the second control winding means takes the practical form of a pair of windings. The first winding of the pair encircling the "one" branch, is adapted to be connected to an output current carrying electrode of the first switching device, and is phased to create a flux in the same sense as the primary power winding associated with the first switching device. Similarly, the second winding of the pair encircling the "one" branch, is adapted to be connected to an output current carrying electrode of the second switching device and is phased to create a flux in the same sense as the primary power winding associated with said second switching device. When the switching device is a transistor, the output electrode to which connection is made may be either the emitter or the collector.

Alternately, the second control winding means may encircle the "other" branch, and when shunted by a low impedance resistive load, may provide the desired flux steering effect.

One or both of the transformer core members may take the form of a c core within a slot formed in one abutting surface. The slot should be large enough for insertion of the first and second control winding means.

Alternately E cores may be used with the primary and secondary power windings on the central arm and the control winding means on the outer arms.

Another core that is suitable for the present arrangement is the "cup" core. Normally the power windings encircle the center portion of the cup core and the control windings encircle one of the outer half cylindrical arms.

Cross cores may also be used. Typically, three of the outer arms may be used for regenerative feedback and one for flux steering or degeneration. One may also use two for regenerative feedback and two for flux steering, or one for regenerative feedback and three for flux steering.

When two cup core halves are employed, adjustable control core cross sections are possible. The primary and secondary power windings encircle the central arm as before. One end of each control winding means passes through a slot in one half cup core, the mid-section passes to one side of the central arm, and the other end passes through the opposing slot in the other half cup core. In this manner, the branch of the core which the control winding means links is formed partly of the one and partly of the other half cup core. In addition, when one half core is rotated with respect to the other, the effective cross-sectional area of the core branch may be adjusted.

As a further aspect of the invention, a simple starting circuit for transistor switching devices is provided. It comprises a resistance, a capacitance and a diode. The transistors are coupled in base input-emitter common configuration. The first control winding means is center tapped, having the winding ends coupled to the bases of the switching transistors. The center tap is coupled through the resistance to the center tap on the primary power winding. The center tap is also coupled to ground by the capacitance and the diode in parallel, with the diode being connected in a sense opposite to the input junctions of the switching transistors. The capacitor in the circuit charges up when the source is energized and causes one or the other of the transistors to conduct instituting oscillation. Once oscillation has started, the diode and capacitor develop a negative potential, useful in sweeping out stored charge at the end of each conduction period.

BRIEF DESCRIPTION OF THE DRAWING

The novel and distinctive features of the invention are set forth in the claims appended to the present application. The invention itself, however, together with further objects and advantages thereof may best be understood by reference to the following description and accompanying drawings in which:

Figure 1:
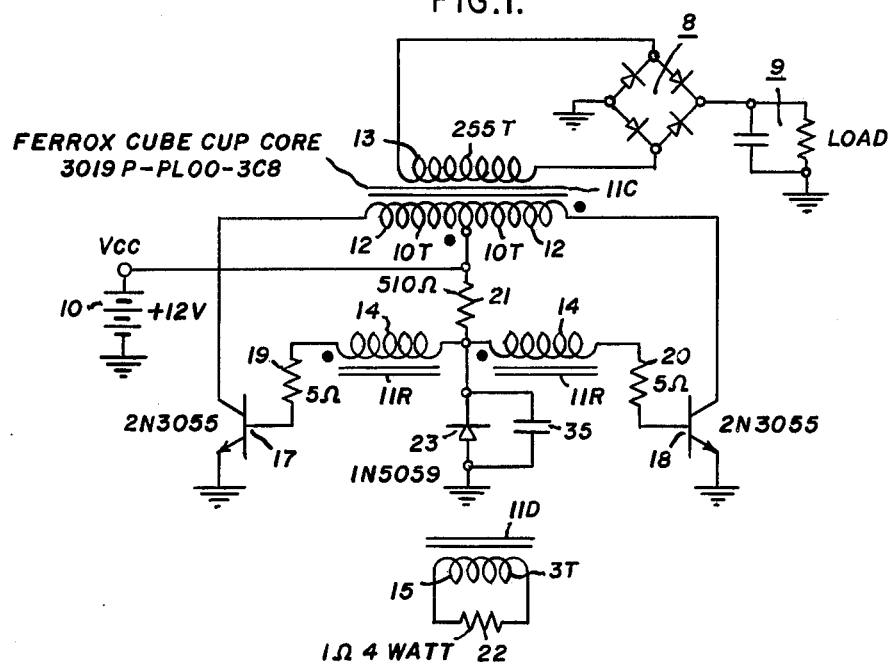
FIG. 1 is an electrical circuit diagram of a static inverter utilizing a power transformer in accordance with the invention having a branched core formed from conventional cup cores. The winding encircling the one branch is used for regeneration and cross-coupling, while the winding encircling the other branch steers flux into the first branch to insure its prior saturation.
Figure 3:
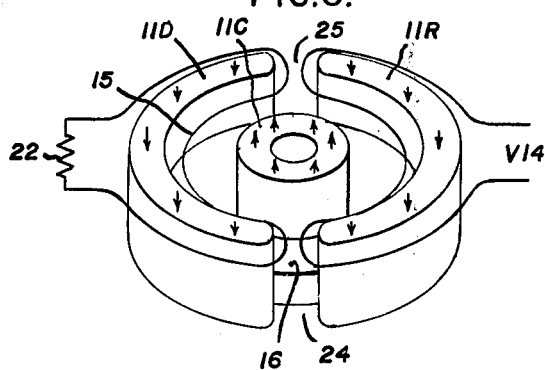
FIG. 3 is a mechanical drawing showing one half of the cup core assembly from which the branched transformer core is assembled and the disposition of the regenerative and flux steering windings on the branches.

DESCRIPTION OF A PREFERRED EMBODIMENT:

FIG. 1 illustrates the circuit of a static inverter using a novel power transformer. Two control windings and one-half of the cup core of the power transformer are shown in FIG. 3.

The static inverter utilizes an oscillation circuit as a "chopper" for performing the inversion from d.c. to a.c. Inversion from d.c. to a.c. permits an output voltage to be transformed to a higher or lower value as required for the intended application. The a.c. output may be used in a.c. form, or rectified to convert it back to d.c. as shown in FIG. 1. In performing the inversion from d.c. to a.c., a major interest of the present invention is to do so with an economy of design.

The static inverter of FIG. 1 comprises a novel power transformer having a branched core upon the working cross-section of which a center-tapped primary power winding 12 and a secondary power winding 13 are wound. The power transformer further comprises a center tapped regenerative control winding 14 wound about a "regenerative" branch of the core and a current steering control winding 15 wound about the other or "degenerative" branch of the core. The inverter includes a pair of power switching transistors 17 and 18, a d.c. power source 10, a full wave rectifier bridge 8, resistances 19, 20, 21, 22, capacitor 35 and diode 23. The inverter may be regarded as having a control circuit, a starting circuit and a power circuit. The power circuit will be discussed first.

The power circuit, which comprises the switching transistors 17 and 18 and primary (12) and secondary (13) power windings furnishes power from the d.c. source 10 to the load 9. The transistors 17 and 18 each have base, emitter and collector electrodes. Both emitters are grounded. The collector of transistor 17 is connected to an undotted end of the center-tapped primary winding 12 and the collector of transistor 18 is connected to the dotted end terminal of the center tapped primary winding 12. The center tap of the primary winding 12 is connected to the positive terminal of the d.c. source 10. The source 10 is grounded, thus completing the primary power circuit through the switching transistors 17 and 18. Assuming that transistors 17 and 18 are controlled to be alternately conducting, a path for current derived from source 10 is completed through the alternate halves of the primary winding, thus generating an alternating flux in the working cross-section of the core. In response to the alternating flux in the core, an alternating output voltage is developed in the secondary power winding 13. That alternating output voltage is rectified in the full wave rectifier bridge 8 and applied to the load 9.

The control circuit is responsible for controlled alternate conduction of the transistors 17 and 18. The control circuit acts in response to the flux conditions in the core and its branches, and applies a control to the bases of the switching transistors 17 and 18. In performing that control, it provides regeneration and cross coupling for the oscillation circuit.

Regeneration and coupling is provided by the center tapped feedback winding 14 and resistances 19 and 20. The center tapped winding 14 has its dotted terminal connected through resistances 19 to the base of transistor 17 and its undotted terminal coupled through the resistance 20 to the base of transistor 18. The center tap of winding 14 is coupled through a resistance 21 to the positive terminal of the source 10 and to the cathode of diode 23, whose anode is grounded. The diode 22 is shunted by a capacitor 35. The resistances 19 and 20 are current limiting resistances and the resistance 21, diode 23 and capacitor 35 form an oscillation starting circuit. When transistor 17 is conducting (assuming that the main core is in the linear region), regenerative winding 14 couples a self-regenerative feedback to the base of transistor 17 tending to further increase its collector current. The winding 14 at the same time applies a conduction inhibiting potential to the base of the other transistor 18, as required for proper cross coupling, tending to further turn it off.

Figure 2:
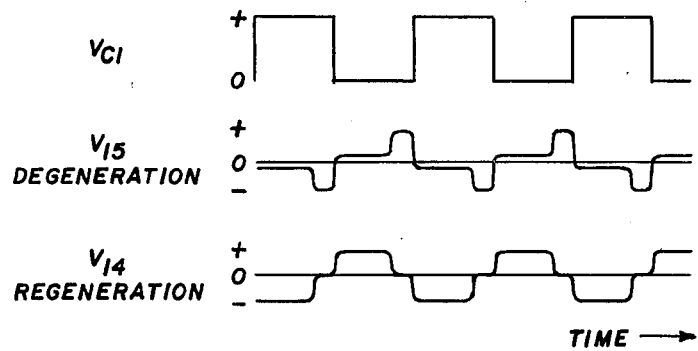
FIG. 2 illustrates three waveforms useful in explaining the operation of the FIG. 1 inverter.

The regenerative and cross-coupling action of the winding (14) is weakened as the regenerative branch approaches saturation and this aids in bringing about current reversal in the inverter. The voltage waveforms of the inverter are shown in FIG. 2. The first waveform is a graph of the collector voltage ($V_{c1}$) of the switching transistor 17 as the collector alternates from being non-conductive to conductive, producing an approximately square wave output. The regenerative waveform (V14) is the third and lowest of the three waveforms. It consists of a conduction favoring potential applied to the base of transistor 17, starting at the switching instant ($V_{c1}$ going to zero) and continuing until prior to the end of the conduction period of transistor 17, when the regenerative branch of the core saturates. The induced voltage in winding 14 remains at zero until the other transistor (18) switches on, after which it causes a conduction inhibiting potential at the base of transistor 17 and a conduction favoring potential at the base of transistor 18. The conduction inhibition on transistor 17 continues until near the end of transistor 18's conduction period, at which time the regenerative branch saturates reversely.

Saturation of the regenerative branch (11R) before the other branch (11D) is insured by the flux steering winding 15 wound about the degenerative branch. Winding 15 is loaded by a shunt resistance 22, which generates a magnetomotive force, tending to force the main core flux out of the degenerative branch and steering it into the regenerative branch until the regenerative branch is saturated. At the instant the regenerative branch saturates, the flux spills over into the degenerative branch. The flux steering winding 15 tends to maintain a low induced e.m.f. up until the moment that the regenerative core saturates, at which point there is a large step up in the induced potential. The large induced potential continues until the reversal of current in the central core. The waveform on winding 15 is the second waveform in FIG. 2. While in the embodiment shown, the winding 15 is not directly connected into the base circuit of the switching transistors, if one needs additional drive to sweep out stored charges in the switching transistors, connection to the bases may be made in a sense opposite to that of the regenerative winding (14). In that event, the flux steering winding 15 would be center tapped, and a pair of diodes would be provided having their anodes coupled to the bases of the switching transistors and their cathodes coupled to the respective winding ends.

The effect of the reduction in regeneration and optional increase in degeneration prior to the end of the conduction cycle when a branch of the core saturates is to initiate transistor switching by reducing the forward bias prior to full core saturation. Thus, the arrangement prevents stresses on the switching transistors that would occur if the inductive load were allowed to fall to near zero impedance and allowed to demand full current of a switching transistor that is still forward biased.

The branched core of the FIG. 1 inverter is illustrated in part in FIG. 3. The upper half cup core, which is not shown, is identical to the half shown, and when assembled, is placed on top of the lower half in the manner to be detailed below. For clarity, the power windings are not illustrated, and only a single turn of each control winding is shown. The illustrated lower half has a central branch or arm (11C) and a first (11R) and a second outer branch or arm (11D), all three of which project (upwardly in FIG. 3) from a common base 16. The first and second outer branches (11R and 11D) are both approximately semi-cylindrical, extending nearly half way around the circumference of the base 16 and being separated by a pair of narrow slots (24, 25) that extend the full height of the branch, and which are designed to provide an opening to admit windings into the interior of the core. When the upper core half and the lower core half are in assembled position, the two members are aligned coaxially, with the slots 24, 26 normally also in alignment. The butting surfaces of the outer arms are carefully ground so that when they are assembled, minimum air gaps are formed at the interfaces. The butting surfaces of the central arm section may or may not have a separation (air gap) as needed. In the first practical embodiment the central gap is minimum. The core halves form a closed chamber, which may be opened to admit preformed windings. This avoids the need for serially threading the windings in as an unformed condition through a closed aperture. The cores are assembled and the chamber closed about the preformed windings.

The primary power winding 12 and secondary power winding 13 are not illustrated, but are wound about the central arm of the cup core made up of the lower and upper halves of the cup core. In a practical case, there are 20 primary turns and 255 secondary turns. When the primary power winding is energized by conduction of one of the switching transistors, a flux is created which goes vertically (upward as illustrated by the arrows in FIG. 3) through the central arm of the lower half, crosses the unavoidable air gap into the central arm of the upper half core, continues radially in the base or web of the upper half core, turns and proceeds vertically down the two outer arms of the upper half core and crosses the air gap into the outer arms (11R and 11D) of the lower half core. The flux path is completed from the outer arms (11R and 11D) by an inwardly directed radial path in the base 16 of the lower half core to the central arm (11C). Thus, when the two half cores are assembled about the windings which are wound around the central arm, a continuous closed magnetic path (except for the minimal air gaps at the mating butt joints of the two cup cores) encircles the windings at all points along their circumference except at the slots (24, 25). The cup core is designed to operate in this closed manner, and the cross-sectional area of the central arm (11C) is equal to the working cross-section of the core. The sum of the cross-sectional areas of the two outer arms (11R and 11D) is also approximately equal to this working cross-section. The bases which close the path about the power windings usually have a slight excess of magnetic cross-section. In this manner the working cross-section of the core is maintained in a closed path about the power windings.

In the normal operation of such cores of inverters, the core material is driven back and forth between forward and reverse saturated magnetic states, and since there are no windings coupled to either of the individual outer arms (11D, 11R), the order in which they saturate is of no particular concern. In the present invention, windings are coupled to the individual outer arms and the order in which they saturate is of concern.

Returning now to FIG. 3, two windings are shown coupled to the individual outer branches. The regenerative winding 14 is shown as a single turn passing (in) through the slot 24, encircling the regenerative outer branch (11R) of the core and passing (out) through the slot 25. In a practical embodiment, the winding may have six turns rather than the single turn illustrated. Similarly, the flux steering winding passes (in) through the slot 24, encircles the degenerative outer branch (11D) of the core and passes (out) through the slot 25. In a practical embodiment, the flux steering winding may have three turns.

When the FIG. 3 winding arrangement is employed, the magnetomotive force from the shunted, heavily loaded turn (the resistance 22 is 1 ohm 4 watts), (11D) of the core and forces the main flux into the regenerative outer branches (11R). When the regenerative outer branch saturates, the still increasing main flux has nowhere else to go, and steers into the degenerative branch. At that instant the regenerative drive to the switching devices terminates and the degenerative drive increases sharply.

The steering effect of the shunted turn 15 is reduced somewhat by the fact that the steering flux must pass through two air gaps in series. The air gaps also occur in series for the main flux. (The steering effect would be improved if the air gaps were avoided.) The steering effect is normally weakened as the slots 24, 25 assume shorter vertical dimensions and strengthened as the slots extend to the full height of the assembled core or into the webs. The illustrated cup core is of the type that is in common manufacture and is of low cost.

The flux steering effect of the turn 15 wound about the degenerative branch of the core and provided with heavy loading may also be produced by the use of a winding coupled into the collector or emitter paths of the switching transistor and wound about the regenerative branch of the core. These two arrangements are illustrated respectively in FIGS. 5 and 6. In both arrangements, the sense of the winding is to create a flux in the branch in the same direction as the flux generated in the core by the primary power winding 12. (In these configurations the need for a shunting load is eliminated.)

Figure 5:
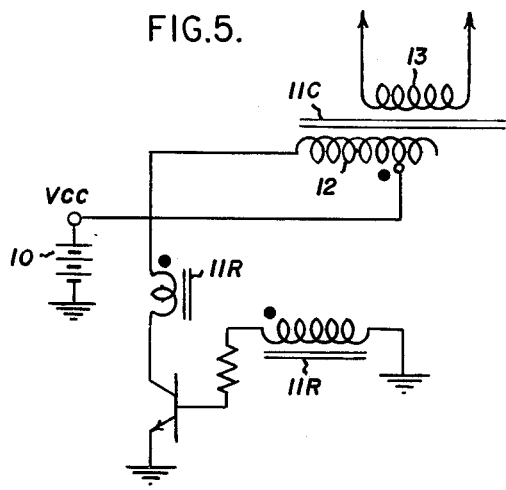
FIG. 5 is a circuit diagram of one-half of a second inverter in which a regenerative and a collector coupled flux steering winding are used; associated with the same branch of the core.
Figure 6:
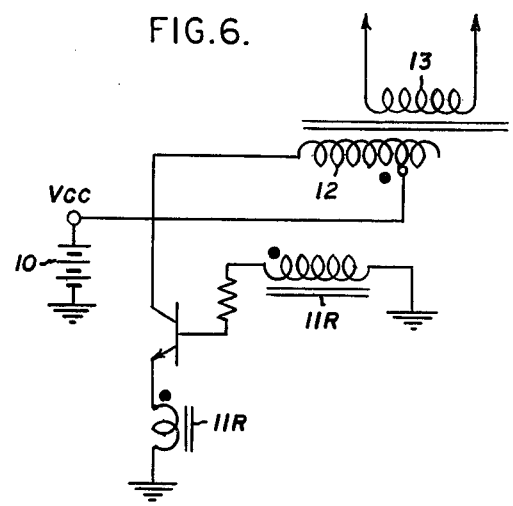
FIG. 6 is a circuit diagram of one-half of a third inverter in which the regenerative and an emitter coupled flux steering winding are used: associated with the same branch of the core.

The starting circuit of the FIG. 1 embodiment is responsible for initiating the initial oscillations. It is not used with current feedback control windings such as are shown in FIGS. 5 and 6. While a switch is not shown, it would ordinarily be introduced at the point of connection of the inverter to the external source 10. The inverter may be de-energized by the same switch to stop the oscillation. The starting circuit includes the resistance 21, diode 23 and capacitor 35. The capacitor 35 may be omitted, where the diode has appreciable stored charge.

When power is applied initially, the capacitor 36 is at zero volts and uncharged. It charges up gradually to a positive value which forces the transistors 17 and 18 to be forward biased. Since they are connected in a regenerative mode, one or the other will latch (turning itself fully on and the other fully off). This starts the oscillation.

During oscillation, the capacitor voltage is maintained at about one diode drop negative. This negative bias causes a periodic sweep-out of charges stored in the transistors when the regenerative drive terminates at the end of each conductance period. The starter is simple and efficient. In addition to the beneficial side effect of "sweep-out", it also forces commutation, in the event that natural commutation does not occur.

Figure 4:
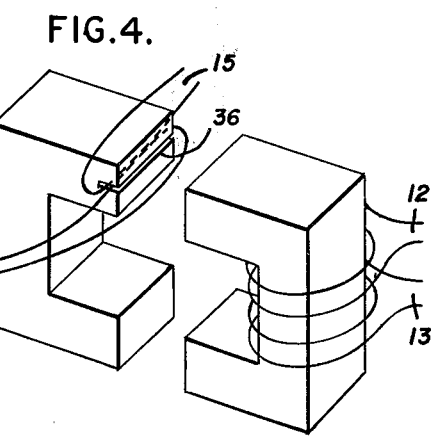
FIG. 4 is a mechanical drawing showing a transformer in which two c cores are utilized, with a slot in the abutting surface of one core.

While the conventional cup cores illustrated may be used in a flux steering mode without modification, the conventional c core illustrated in FIG. 4 may be employed with only slight modification. That slight modification is in the provision of a slot 36, sawn into one abutting face of one c core. The slot can be readily cut with a diamond saw. The slot provides the requisite branching of the core without drilling the core at some more central location. Drilling in ferrite materials is a very tedious process since they are very hard. Since the slot 36 is open before assembly of the two cores, preformed control windings can be assembled into the slot 36. The direction of the slot is not critical and may be orthogonal to or in the plane of the core, or in some other orientation.

Figure 7:
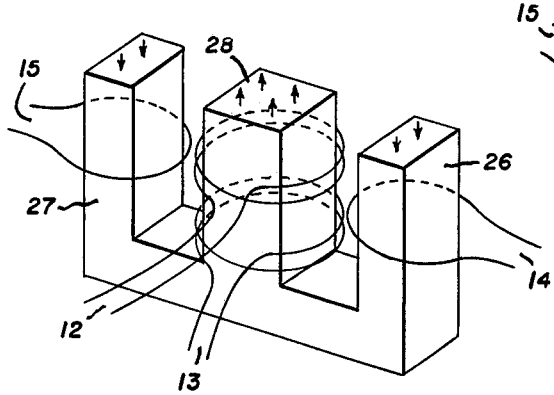
FIG. 7 is a mechanical drawing of one-half of a core of a novel power transformer assembled from two E cores, and illustrating the disposition of the power, regenerative and flux steering windings on the branches.

The invention may also be applied to other conventional core configurations, as for instance the E core configuration illustrated in FIG. 7. In that configuration, regenerative winding 14 encircles the outer arm 26 and a flux steering or degenerative winding 15 encircles the other outer arm 27. The primary power windings 12 and 13 are wound on the central core 28. As in the other configurations, the E core is normally combined with a second E core or an I bar placed on top of it so as to provide closure about the windings. In addition, the cross-section of the central core 28 is usually made equal to the sum of the cross-sections of the regenerative and degenerative or flux steering branches.

Figure 8:
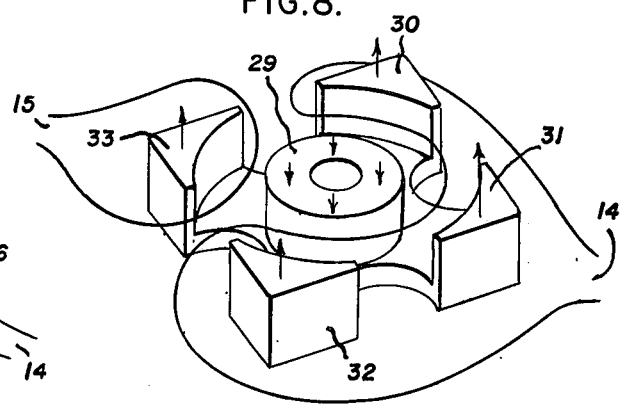
FIG. 8 is a mechanical drawing of a core of a novel power transformer assembled from two cross cores and illustrating the disposition of the regenerative and flux steering windings of the branches.

The branched cores may also be formed using cross cores of the type illustrated in FIG. 8. The central hub 29 of the core forms the support for the primary and secondary power windings. The regenerative windings may then encircle the outer branches 30, 31 and 32 while the degenerative or flux steering winding may encircle the fourth branch 33. In this arrangement, the area of the central hub 29 is made equal to the sums of the areas of the individual outer arms 30, 31, 32 and 34. This arrangement permits a larger percentage of the core to be used for the regenerative function and permits one to reach a condition nearer to full core saturation before the regenerative branches saturate.

The maximum power output of the inverters so far described is dependent in part upon the core size and configuration and in part on the characteristics of the individual switching devices. The cores which are herein proposed and which are assembled from available commercial configurations normally require greater flux steering currents than in cores in which no air gaps are required in the path of the flux steering winding. Accordingly, the power transistors in these configurations should have greater current gains. In respect to the core configurations, the closed cup cores normally have the poorest ventilation and the smallest radiation surface per unit of mass. The advantage of the configuration is that the electromagnetic radiation is minimized. Available sizes of such cores are typically operated at power levels below 100 watts. Higher powers may be achieved with the "cross" cores which have cut-outs between the individual arms so as to provide a more open and more readily ventilated construction. The C and E cores are used quite open. These may be operated at much higher power levels, typically up to the kilowatt range.

Figure 9:
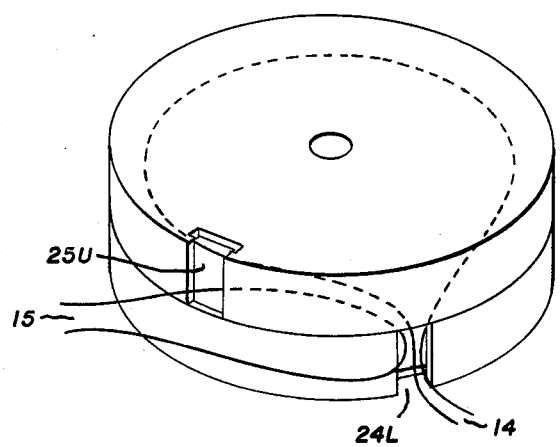
FIG. 9 is a mechanical drawing of an assembled transformer core using two cup cores which may be rotated relatively to one another to adjust the cross-section of the one branch of the core relative to the other.

The configuration illustrated in FIG. 3 may have adjustable regenerative and flux steering arms. The adjustable version is illustrated in FIG. 9. In the FIG. 9 configuration, the primary and secondary power windings 12 and 13 are wound on the central core as before and are not shown. The upper and lower cup cores are initially aligned with their near slots (24L and 24U) and their far slots (25L and 25U) together. The regenerative winding passes through the lower slot (24L), passes to the right side of the central arm and passes through the opposing slot (25U) in the upper member. The degenerative or flux steering winding uses the same slots (24L and 25U) but passes to the other side of the central arm. If one now rotates one of the two C cores in respect to the other in the manner illustrated in FIG. 8, the regenerative winding 14 now magnetically encircles a portion of the outer branches larger than one-half the circumference of the cup core. The cross-section of the core encircled by the flux steering or degenerative winding 14 is that commencing from the near lower slot (24U) and going counter clockwise to the previously far upper slot (25U). The cross-section of the core encircled by the flux steering degenerative winding 15 is that defined by the same two slots but measured clockwise from near slot (24L). In FIG. 8 the angular coverage of the regenerative winding is about 300°, while that of the degenerative winding is about 60°. The core may in fact approach either limit in which one winding is coupled to all of the outer branches, while the other winding is coupled to substantially none, or vice versa.

The foregoing adjustment permits one to adjust the frequency of the inverter over a limited range when it operates in the usual free running condition. It also allows one to set the level of core saturation, and the transistor stress levels. It also permits one to optimize the balance between regenerative and degenerative feedback when the two are applied to control the switching transistors.

What we claim as new and desire to secure by Letters Patent of the United States is:

1. A transformer adapted to be coupled to a pair of switching devices to form an inverter having:
    1. a core of substantially linear magnetic material providing a closed magnetic path along which a working cross-section is maintained for the principal flux, said path being divided for part of its length in two branches between which the principal flux may be steered with a relatively small magnetomotive force, said core being assembled from two members which are butted at the branch to permit encirclement of one of said branches by a preformed winding,
    2. a center tapped primary power winding encircling said working cross-section, each end of which is adapted to be connected to an output electrode of one of a pair of alternately conducting electronic switches, and the center tap of which is adapted to be connected to a d.c. source to cause the principal flux in said core to alternate,
    3. a secondary power winding encircling said working cross-section for deriving an alternating voltage output.
    4. first control winding means adapted to be connected to said switches to cause alternate conduction, said winding encircling one branch and providing regenerative feedback during each conduction period which terminates when said one branch saturates, and
    5. second control winding means encircling one of said branches for providing a magnetomotive force for causing said one branch to saturate first in each conduction period to remove the regenerative feedback before saturation of the working cross-section.

2. The transformer set forth in claim 1 wherein said second control winding comprises a pair of windings, the first of which encircles said one branch and is adapted to be connected to an output current carrying electrode of said first switching device and phased to create a flux in the same sense as the primary power winding associated with said first switching device, and
    the second of which encircles said one branch and is adapted to be connected to an output current carrying electrode of said second switching device and phased to create a flux in the same sense as the primary power winding associated with said second switching device.

3. The combination set forth in claim 1 wherein said second control winding means encircles the other branch and is shunted by a low impedance resistive load.

4. The combination set forth in claim 1 wherein one of said core members is a C core with a slot formed in one surface abutting the other core member for insertion of said first and second control winding means.

5. The combination set forth in claim 4 wherein both of said core members are C cores.

6. The combination set forth in claim 1 wherein
a. at least one of the core members is a three-armed E core of which the central arm has a cross-sectional area approximately equal to the sum of the cross-sectional area of the two outer arms,
b. said primary and secondary power windings encircle said central arm,
c. said first control winding means encircles one of said outer arms, and
d. said second control winding means encircles one of said outer arms.

7. The combination set forth in claim 1 wherein
a. at least one of the core members is a half cup core, which has a central cylindrical arm and two outer arms each of which have the form of an incomplete half cylinder encircling said central arm, said outer arm being defined by two slots, the cross-sectional area of the central arm being approximately equal to the sum of the cross-sectional areas of said two outer arms,
b. said primary and secondary power windings encircle said central arm, c. said first control winding means encircles one of said outer arms, and d. said second control winding means encircles one of said outer arms.

8. The combination set forth in claim 1 wherein a. at least one of the core members is a half cross core, which has a central cylindrical arm at the center of the cross and four outer arms at the extremities of the cross, the cross-sectional area of the central arm being approximately equal to the sum of the cross-sectional area of the four outer arms, b. said primary and secondary power windings encircle said central arm, c. said first control winding means encircles at least one of said outer arms, and d. said second control winding means encircles the remainder of said outer arms.

9. An adjustable transformer as set forth in claim 1 wherein a. both of the core members are halves of a cup core assembly, each of which has a central cylindrical arm, and two outer arms of which each has the form of an incomplete half cylinder encircling said central arm, said outer arms being defined by two slots, the cross-sectional area of said central arm being approximately equal to the sum of the cross-sectional areas of said two outer arms, b. said primary and secondary power windings encircle said central arm, c. one end of said first control winding means passes through a slot in one half cup core, the mid-section passes to one side of the central arm, and the other end passes through a slot in the other half cup core, which latter slot is opposing when the slots in the two half cup cores are aligned, d. one end of said second control winding means passes through said one slot, the mid-section passes to one side of said central arm, and the other end passes through a slot in the other half cup core, which latter slot is opposing when the slots in the two half cup cores are aligned, e. the abutting of said cup core halves causing each control winding arm to encircle a branch of the core formed partly of the one and partly of the other half cup core, the effective cross-section of the branch being dependent upon the relative rotational position of said half cup cores.

10. In combination with the transformer set forth in claim 1 a. means for starting the inverter comprising a resistance, a capacitance and a diode, b. a pair of transistor electronic switching devices having the collectors thereof coupled to the respective ends of said center tapped primary power winding, the emitters thereof grounded, and wherein c. said first control winding means is a center tapped winding having each end coupled to a base of one of said switching transistors, and wherein d. the center tap of said first control winding means is coupled through said resistance to the center tap on said primary power winding and to ground by said capacitance and said diode in parallel, said diode being connected in a sense opposite to the input junctions of said switching transistors, to apply a forward bias at the center tap of said first control winding and to said transistor bases until said transistors begin to conduct, after which a reverse bias is developed by said diode across said capacitance for sweeping out stored charge at the end of each conduction period.

* * * * *